United States Patent
Lee et al.

(10) Patent No.: US 7,579,759 B2
(45) Date of Patent: Aug. 25, 2009

(54) SURFACE ACOUSTIC WAVE (SAW) DEVICES BASED ON CUBIC BORON NITRIDE/DIAMOND COMPOSITE STRUCTURES

(75) Inventors: Shuit-Tong Lee, Hong Kong (HK);
Wen-Jun Zhang, Hong Kong (HK);
You-Sheng Zou, Hong Kong (CN); Igor Bello, Hong Kong (HK); Kwok Leung Ma, Hong Kong (HK); Kar Man Leung, Hong Kong (HK); Yat Ming Chong, Hong Kong (HK)

(73) Assignee: City University of Hong Kong, Hong Kong (CN)

( * ) Notice: Subject to any disclaimer, the term of this patent is extended or adjusted under 35 U.S.C. 154(b) by 0 days.

(21) Appl. No.: 11/760,996

(22) Filed: Jun. 11, 2007

(65) Prior Publication Data

US 2008/0303378 A1    Dec. 11, 2008

(51) Int. Cl.
*H01L 41/09* (2006.01)
(52) U.S. Cl. .................... 310/358; 310/313 R
(58) Field of Classification Search .............. 310/328, 310/358, 311, 338, 313 R, 313 B, 313 A; 428/216
See application file for complete search history.

(56) References Cited

U.S. PATENT DOCUMENTS

| | | | |
|---|---|---|---|
| 5,777,422 A | 7/1998 | Kitabayashi et al. | 310/313 A |
| 5,855,998 A * | 1/1999 | Tanabe et al. | 428/216 |
| 5,959,389 A | 9/1999 | Nakahata et al. | 310/313 A |
| 6,642,813 B1 | 11/2003 | Itakura et al. | 333/193 |
| 6,661,313 B2 | 12/2003 | Naumenko et al. | 333/193 |
| 6,838,807 B2 | 1/2005 | Ozaki et al. | 310/313 D |
| 7,095,157 B2 * | 8/2006 | Sung | 310/313 R |

OTHER PUBLICATIONS

Nakahata et al., "Study on Surface Acoustic Wave Characteristics of SiO$_2$/Interdigital-Transducer/ZnO/Diamond Structure and Fabrication of 2.5 GHz Narrow Band Filter," Jpn. J. Appl. Phys., vol. 37 (1998) pp. 2918-2922.

(Continued)

*Primary Examiner*—Thomas M Dougherty
*Assistant Examiner*—Karen B Addison
(74) *Attorney, Agent, or Firm*—Heslins Rothenberg Farley & Mesiti P.C.

(57) ABSTRACT

A surface acoustic wave (SAW) device which is made of cBN/diamond composite structures and the fabrication method are disclosed. In the SAW device based on cubic boron nitride and diamond composite structures, the diamond hard layer includes randomly-oriented polycrystalline diamond (poly-D), oriented (heteroepitaxial) diamond, single-crystal diamond wafers and nanocrystalline diamond (nano-D) films. The cBN film with a sound velocity close to that of diamond serves as the piezoelectric layer, which was directly deposited on diamond hard layer without any soft sp$^2$-BN incubation layer by ion assisted physical vapor deposition (PVD) and plasma-enhanced (or ion assisted) chemical vapor deposition (PECVD). Due to the high sound velocity and the low velocity dispersion between the cBN and diamond layered materials, the present SAW device based on cubic boron nitride and diamond composite structures can improve the device performance and operate at ultra-high frequency range.

14 Claims, 11 Drawing Sheets

OTHER PUBLICATIONS

Elmazria et al., "High Velocity SAW Using Aluminum Nitride Film on Unpolished Nucleation Side of Free-Standing CVD Diamond," IEEE Transactions on Ultrasonics, Ferroelectrics, and Frequency Control, vol. 50, No. 6, Jun. 2003, pp. 710-715.

Nakahata et al., "High Frequency Surface Acoustic Wave Filter Using ZnO/Diamond/Si Structure," Jpn. J. Appl. Phys., vol. 33 (1994) pp. 324-328.

Iriarte et al., "Surface acoustic wave propagation characteristics of aluminium nitride thin films grown on polycrystalline diamond," Journal of Applied Physics, vol. 93, No. 12, Jun. 15, 2003, pp. 9604-9609.

Bi et al., "Surface acoustic waves on nanocrystalline diamond," Diamond and Related Materials 11 (2002) pp. 677-680.

Bénédic et al., "Surface acoustic wave devices based on nanocrystalline diamond and aluminum nitride," Diamond and Related Materials 13 (2004) pp. 347-353.

Uemura et al., "Low-Loss Diamond Surface Acoustic Wave Devices Using Small-Grain Poly-Crystalline Diamond," Jpn. J. Appl. Phys., vol. 41 (2002) pp. 3476-3479.

Ishihara et al., Synthesis and Surface Acoustic Wave Property of Aluminum Nitride Thin Films Fabricated on Silicon and Diamond Substrates Using the Sputtering Method, Jpn. J. Appl. Phys., vol. 40 (2001) pp. 5065-5068.

Jiang, X. and Klages, C.-P., "Heteroepitaxial diamond growth on (100) silicon," Diamond and Related Materials, 2 (1993) 1112-1113.

Mirkarimi et al., "Review of advances in cubic boron nitride film synthesis," Materials Science and Engineering, R21 (1997) 47-100.

Zhang et al., "Epitaxy on Diamond by Chemical Vapor Deposition: A Route to High-Quality Cubic Boron Nitride for Electronic Applications," Adv. Mater. 2004, 16, No. 16, Aug. 18, pp. 1405-1408.

\* cited by examiner

SURFACE ACOUSTIC WAVE (SAW) DEVICES BASED ON CUBIC BORON NITRIDE/DIAMOND COMPOSITE STRUCTURES

FIELD OF THE INVENTION

The present invention relates to surface acoustic wave (SAW) devices which can operate at high frequency, and more particularly, to surface acoustic wave devices based on cubic boron nitride and diamond composite (cBND) structures.

BACKGROUND OF THE INVENTION

Surface acoustic wave (SAW) devices are critical components in wireless communication systems. SAW devices have been successfully employed for various commercial applications, such as intermediate-frequency (IF) filters for televisions and radio-frequency (RF) filters for mobile telecommunications. Accompanying the remarkable progress of the telecommunications field focusing primarily on cellular telephones and other mobile communications, the demand for surface acoustic wave elements, e.g., tuners capable of receiving broadcast satellite (BS), commercial satellite (CS) broadcasts and radar systems, is increasing rapidly. Therefore, high-performance, high-frequency SAW devices with low insertion loss are required.

A SAW device typically consists of interdigital transducer (IDT) metal electrodes together with a piezoelectric medium for wave generation and propagation. The piezoelectric effect is used to convert electrical energy into acoustic wave energy and vice versa. When an electrical signal is applied to the interdigital transducer electrodes, which are deposited on the piezoelectric member, mechanical stress can be induced followed by the development of a geometric deformation on the piezoelectric member that generates a SAW, which in turn is propagated along the piezoelectric member and received by the other interdigital transducer electrodes as an electrical signal. Information carried by the SAW along the surface of a crystal substrate can be processed during propagation. The signal center frequency ($f_0$) of a SAW device is determined by the velocity of the acoustic wave ($v_\phi$) and the spatial period (wavelength $\lambda$) of the interdigital transducers (IDT), so the device has a bandpass characteristic with a center frequency ($f_0$), which is expressed as $f_0 = v_\phi / \lambda$.

The increase in the amount of information transmission with high bit-rate requires SAW devices operating in high frequencies such as the microwave range. Much effort has been made in the development of higher frequency SAW devices in the GHz range. Increasing the center frequency of SAW devices requires high acoustic wave velocity and/or small wave length (the small IDT spatial period). The wavelength $\lambda$ is generally in the range from hundreds of nanometers to micrometers due to limitations in fabrication technique in IDTs. Reduction of the electrode size also suffers from problems such as reliability, power durability and fabrication margin in the manufacturing processing. Therefore a major effort to increase the center frequency was made through increasing the velocity of surface acoustic waves. The SAW velocity depends mainly on the nature of the medium wherein it transfers. Thus searching for materials with high acoustic velocity is essential for achieving high-frequency SAW devices.

So far, piezoelectric materials used for the SAW device include bulk single crystals, such as lithium niobate, lithium tantalite and quartz, and thin films such as ZnO and AlN films that are deposited on substrates. The single-crystalline piezoelectric bulk $LiNbO_3$ yields a propagation velocity of 3,500 to 4,000 m/s, and $LiTaO_3$ of 3,300 to 3,400 m/s. If SAW devices using these piezoelectric materials are expected to work in high frequency range, e.g., 10 GHz, the spatial period (wavelength $\lambda$) of the IDT must be reduced to less than several hundreds nanometers. To meet the demand for high-frequency and wide-band applications, diamond layer based structures have been employed.

Diamond, the hardest material in the world, is a very promising material for high-frequency SAW filters because it has the highest acoustic velocity among all materials. In addition to the highest Young's modulus, diamond has the highest thermal conductivity as well, which may provide an advantage for high power handling of diamond-based SAW devices. However, diamond itself does not exhibit a piezoelectric effect, therefore to excite SAW in diamond, a piezoelectric layer is required for electromechanical conversion. Polycrystalline diamond films have been successfully synthesized on various substrates by chemical vapor deposition (CVD). Combined with piezoelectric thin films, such as ZnO or AlN, high-frequency SAW devices operating in the gigahertz range based on polycrystalline CVD diamond films have been achieved. Moreover, by using ZnO/nanodiamond/Si and AlN/nanodiamond/Si layered structures, the performance of as-deposited nanodiamond films in the SAW devices was investigated. The high-frequency characterization showed that nanodiamond presents a high surface acoustic velocity similar to that of polycrystalline diamond. So far, the SAW filters of $SiO_2$/ZnO/diamond/Si structure with center frequencies from 2.48 to 5.0 GHz was fabricated, and the insertion loss of such SAW filters was reduced to the range from 1.3 to 3.2 dB. The IDT/AlN/Diamond SAW devices have shown an operating frequency at approximately 2.5 GHz.

For diamond-based SAW devices, the choice of the piezoelectric material is another important consideration, because the phase velocity is determined by the elastic constants of both underlying diamond and top piezoelectric layer. A material with a similar phase velocity to that of diamond will be preferred to minimize the velocity dispersion at diamond/piezoelectric layer interface, and thus to enhance the electromechanical coupling coefficient of the layered structure of SAW devices. Among the piezoelectric materials, cBN (isostructural to diamond), with hardness and elastic modulus next only to diamond, leading to very high sound propagation velocities in the bulk as well as in the surface, would be a very promising candidate for fabricating the new high-frequency, high-performance SAW devices. In order to improve the operating frequency of SAW devices and meet the demands for high frequency and wide band applications, a new SAW device based on cBN/diamond composite structure is presented in the present invention.

SUMMARY OF THE INVENTION

According to the present invention there is provided a high frequency surface acoustic wave device comprising:

a) a diamond layer;

b) a cubic boron nitride (cBN) piezoelectric layer formed on said diamond hard layer, said cBN piezoelectric layer being adapted so as to propagate a surface acoustic wave; and c) a pair of interdigital transducer electrodes (IDT) formed on said cBN piezoelectric layer which are adapted to perform conversion between an electrical signal and a surface acoustic wave.

Preferably the diamond layer is formed on a supporting substrate layer. The supporting layer for depositing of diamond films can be a variety of non-diamond substrates including semiconductors (e.g., silicon or silicon carbide), insulators (i.e., quartz and sapphire), and metals (e.g., platinum and iridium).

The diamond hard layer can be single-crystal diamond wafers, oriented (heteroepitaxial) diamond, randomly-oriented polycrystalline diamond (poly-D), or nanocrystalline diamond (nano-D) films. While single-crystal diamond wafers, oriented and nano-D diamond films with smooth surfaces can be used directly as underlying layers for the deposition of cBN, a post-deposition polishing may be needed to reduce the surface roughness of as-deposited randomly-oriented poly-D films, thus to prevent the scattering to acoustic waves at the interface. The diamond hard films are prepared in a two-step process, i.e., nucleation and growth. The diamond nuclei are preferably formed either by bias-enhanced nucleation or by mechanical prescratching/seeding.

The adhesive cBN films are deposited on diamond by using either plasma enhanced chemical vapor deposition (PECVD) or physical vapor deposition (PVD) methods. Because cBN has the similar crystal structure and lattice constant as diamond, cBN can be deposited directly on diamond without amorphous and turbostratic BN (aBN and tBN) interfacial layer required for cBN nucleation.

Metal (e.g., aluminum) or alloy interdigital transducers (IDT) may be patterned on the surfaces of the cBN piezoelectric films by using the evaporation or sputtering methods combined with the conventional photolithography or electron beam lithography techniques.

BRIEF DESCRIPTION OF THE DRAWINGS

Some examples of the invention will now be described with reference to the accompanying figures, in which.

DETAILED DESCRIPTION OF PREFERRED EMBODIMENTS

At least in its preferred forms the present invention provides a new high-frequency, high-power SAW device based on cubic boron nitride/diamond composite structures wherein the cBN layer, having the hardness and elastic modulus next only to diamond, serves as a piezoelectric medium with high phase velocity and thereby reduces the velocity dispersion at the diamond/cBN interface.

Figure 1:
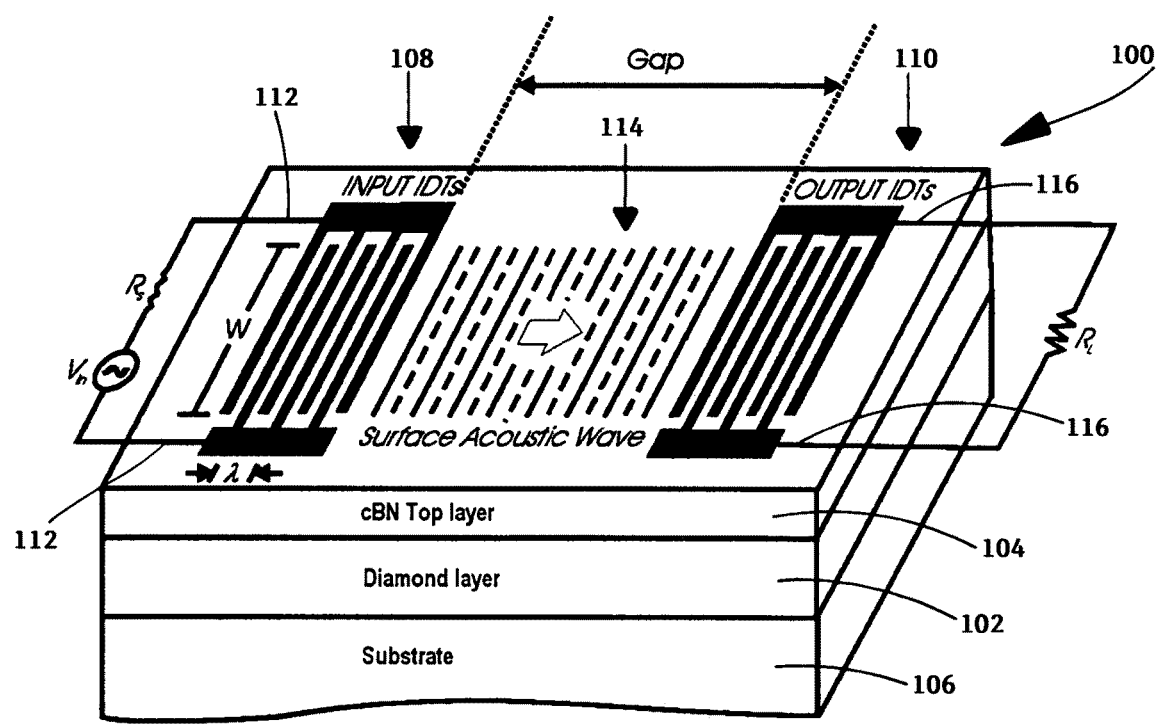
FIG. 1 is a schematic diagram of one example of the general structure of a surface acoustic wave device.

FIG. 1 shows schematically a SAW device 100 with a layered structure which comprises diamond 102 and cBN 104 films on a supporting substrate 106 and interdigital transducer electrodes (IDT) 108, 110 formed on the cBN film. The input electrodes 108 are used to receive electrical signals through terminals 112 and to convert the signals to SAW, and then the SAW propagates along the cBN and diamond surface 114. The output electrodes 110 are used to convert the SAW to electrical signals that are then output through terminals 116.

In embodiments of the present invention, the diamond hard layer may be formed from randomly-oriented polycrystalline diamond (poly-D), oriented (heteroepitaxial) diamond, nanocrystalline diamond (nano-D) films and single-crystal diamond wafers. To reduce or eliminate the influence of the substrate on SAW device characteristics, the diamond film deposited on the substrate is made relatively thick, for example, exceeding 2 µm. The surface roughness of a CVD poly-D film is usually as high as many hundred nanometers to several micrometers and increases with the film thickness, and such a rough surface may lead to SAW energy loss in the interface between poly-D and cBN, resulting in an increase in the insertion loss of the SAW device. To mitigate this potential problem, the as-deposited poly-D films are preferably polished before the deposition of the cBN top layer. The surface polishing can be performed by, e.g., mechanical polishing by diamond powders and chemical etching. However, in the case of nano-D or oriented diamond films, due to the remarkable surface smoothness of these two kinds of diamond films, the polishing step adapted to poly-D film may be omitted.

The deposition of the diamond layer is preceded by diamond nucleation on a pretreated or/and precoated substrate which have the capacity to accommodate the cBND composite with excellent adhesion. The diamond layer is first nucleated preferably using either bias-enhanced nucleation (e.g., Jiang et al., Diamond Relat. Mater., 2 (1993) 1112, hereby incorporated herein by reference in its entirety) on a non-diamond substrate, or enhanced nucleation employing scratching non-diamond substrate by hard powders of different composition and size such as diamond, SiC, $Al_2O_3$ or cBN. Randomly oriented or highly oriented diamond films are then grown via controlling deposition parameters, and the nanocrystalline diamond film is also grown by changing the methane content or in hydrogen-depleted CVD environment.

In embodiments of the present invention, the deposition of cBN/diamond composite structure can be prepared on a variety of non-diamond substrates including semiconductors (e.g., silicon or silicon carbide and nitride), insulators (e.g., quartz and sapphire), metals (e.g., platinum and iridium), and alloys (e.g., tungsten carbide), which can, however, be pretreated as described above. Alternatively, the pretreated substrates can be coated by a buffer layer, for example, with nitride or carbide layers or their combinations and gradient layers. The buffer layers can further be prescratched. All these pretreatments and precoatings can be combined prior to the deposition of cBND composite.

For single crystal diamond acting as the hard layer, due to the sufficient thickness of single crystal diamond wafers, the supporting layer (substrate) can be left out.

Figure 2:
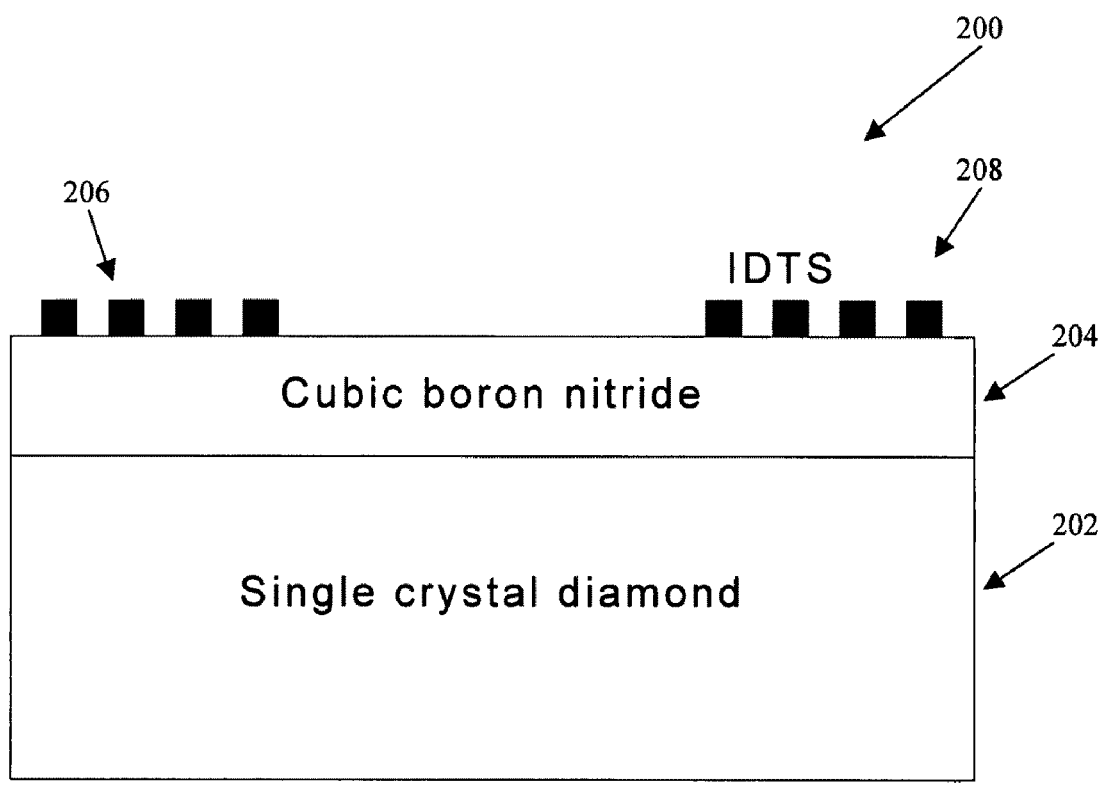
FIG. 2 is a cross-sectional view of one example of a SAW device in accordance with the invention with the structure of IDT/cBN/single-crystalline diamond.

FIG. 2 shows the cross-sectional schematics of one example of the present invention in the form of a SAW device 200 with a IDT/cBN/single-crystalline diamond structure. The single crystal diamond wafer 202 can be obtained, for example, by using high-pressure and high-temperature (HPHT) method. Then cBN piezoelectric film 204 and IDTs 206, 208 are successively deposited on the single crystal diamond wafer. Single crystal diamond wafers in any orientation can be utilized but (001) orientation is preferred due to its relatively smooth surface.

In the preparation of diamond films, CVD environments including either cold and thermal plasmas being excited by direct current, alternating current, radio-frequency, microwave or other electromagnetic radiations are possible. The flame methods can be applied as well. Depending on the excitation method used, power can be supplied into the plasma via internal electrodes, capacitive and inductive coupling, antenna coupling, resonator coupling, surface-wave excitation or other known methods. For example, in the case of diamond film deposition demonstrated as an example below, cold plasma was induced by microwaves, which were fed into a reactor via an impedance transformer.

The surface morphology and the orientation of the intermediate diamond film in the cBN/diamond composite structure are controlled via the growth parameters, e.g., the plasma composition, the concentration of carbon precursor in the CVD environment, substrate temperature and other parameters.

The top cBN layer can be prepared, for example, by a variety of ion assisted physical vapor deposition (PVD) and plasma-enhanced (or ion assisted) chemical vapor deposition (PECVD) methods including, e.g., magnetron sputtering, ion assisted deposition, biased plasma deposition and ion beam deposition. (e.g., Mirkarimi et al., Mater. Sci. Eng., R21 (1997) 47, hereby incorporated herein by reference in its entirety). The cBN structure is also controlled via the growth parameters, e.g., substrate temperature and bias voltage. If the cBN film exhibits a rough surface, it can also be polished using the same method as is proposed for polishing a poly-D surface.

Figure 3:
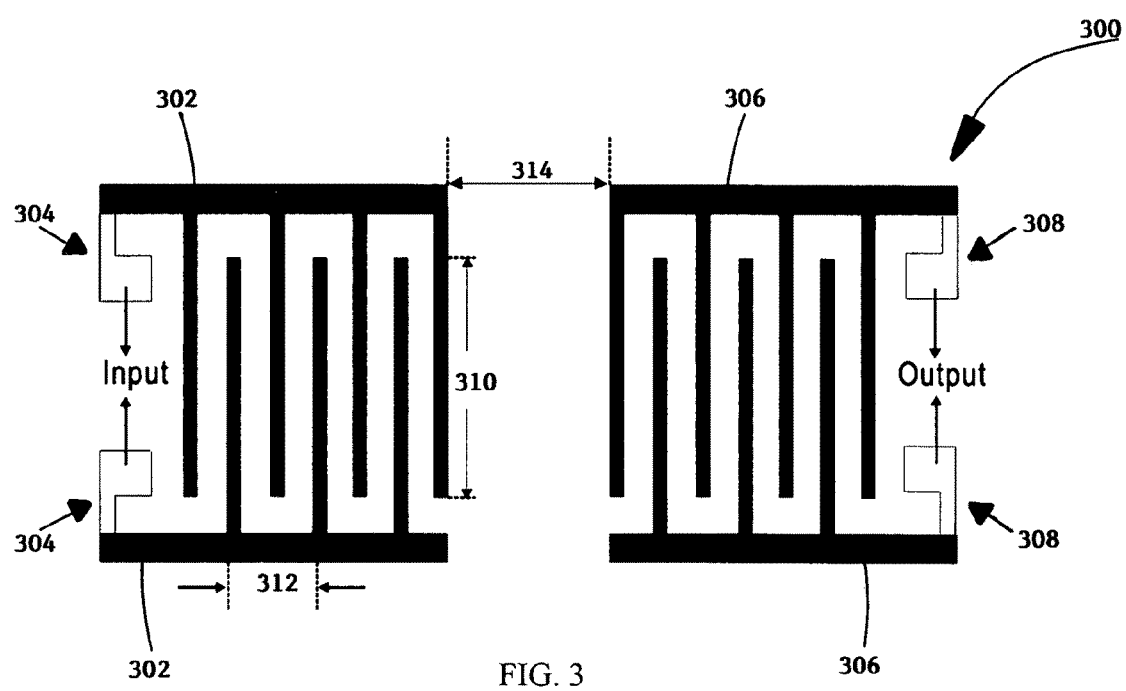
FIG. 3 is a plan view of one example of an IDT used in the present invention.

An example interdigital transducer (IDT) electrode pattern 300 is shown in FIG. 3. The input electrodes 302 are used to receive electrical signals through terminals 304 and to convert the signals to SAW. The output electrodes 306 are used to convert the SAW to electrical signals that may then be output through terminals 308. In the example, metal or alloy IDT electrodes are fabricated, for example, on the surface of cBN film by using, for example, evaporation or sputtering methods combined with conventional photolithography or electron beam lithography techniques. For the SAW devices in different structures, e.g., different crystalline nature of cBN and diamond films and different thickness of layers, the shape and dimensions of IDT (pairs of transducers, aperture length (310), spatial period (wavelength 312), and inter-IDT distance (gap 314) need to be varied accordingly.

The following examples are presented for a further understanding of the cBN/diamond composite structures, and method of cBN/diamond preparation and fabrication of the SAW device based on cBN/diamond composite structure under present invention.

EXAMPLE 1

Figure 4:
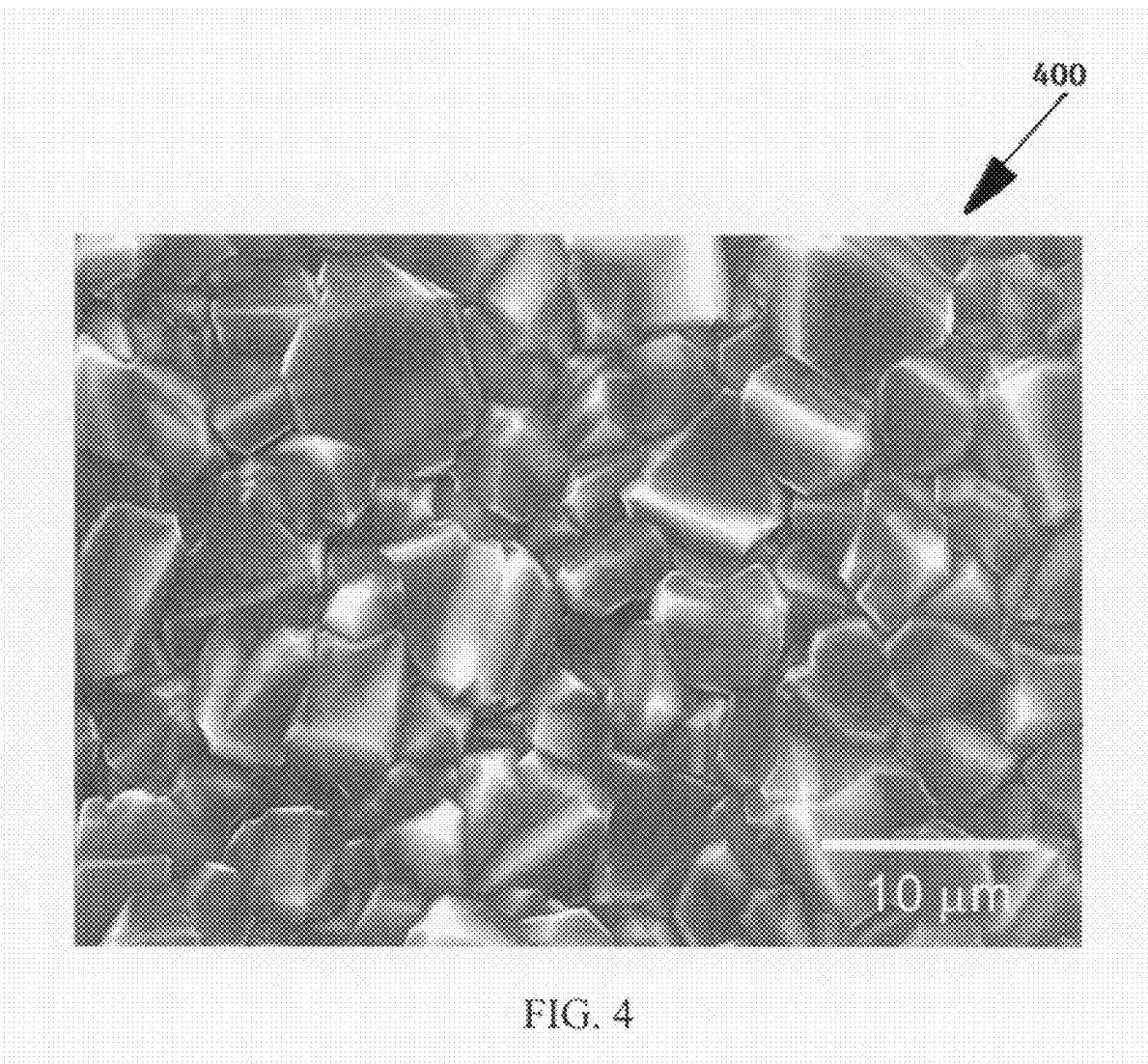
FIG. 4 is a SEM image showing the surface morphology of one example of a polycrystalline diamond film, FIG. 5($a$) shows a SEM plan-view and FIG. 5($b$) shows a cross-sectional image of one example of a cBN/poly-D composite film with the top cBN layer deposited by ECR-CVD.

The SEM image 400 in FIG. 4 shows a randomly-oriented polycrystalline diamond film deposited on a silicon substrate. The film was prepared by microwave plasma CVD in a gas mixture of 1% $CH_4/H_2$. Because grain orientation is random, the film surface is very rough. In order to reduce the SAW propagation loss, the poly-D film is preferably polished prior to the deposition of cBN film.

A polycrystalline diamond film was first deposited on silicon (001) substrate by using a commercial 1.5 kW ASTeX microwave plasma CVD reactor. Prior to diamond deposition, the substrate were ultrasonically abraded for 60 min in a suspension of nanodiamond powder with a grain size of 5 nm in ethanol to enhance the diamond nucleation. During the deposition, plasma was induced in a 1% $CH_4/99\% H_2$ mixture at a pressure of 40 Torr and total gas flow rate of 300 sccm. The deposition temperature was maintained at 850° C., and the microwave power was 1400 W. The duration of deposition was about 4 hours.

Figure 5:
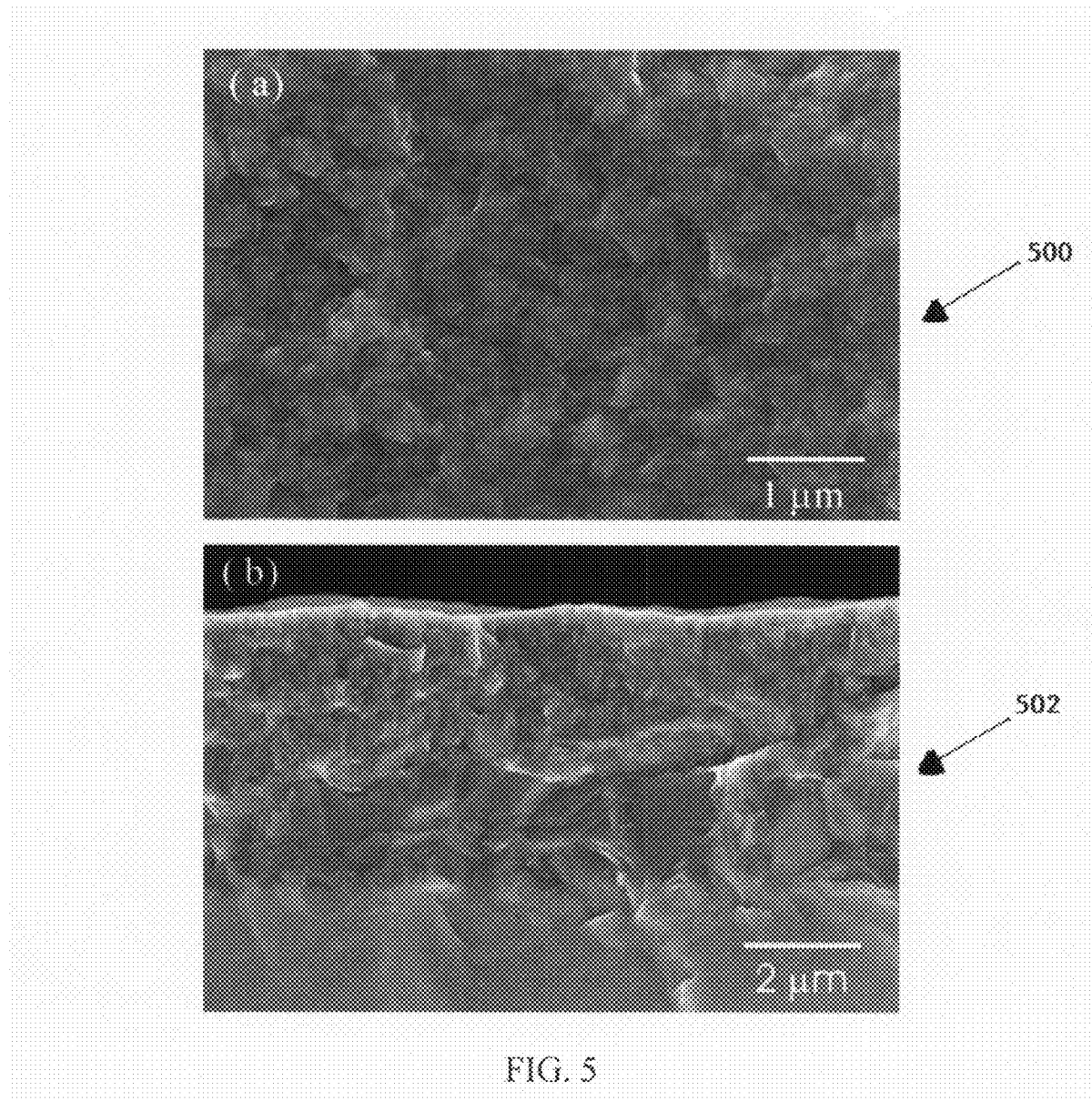

The cBN film was subsequently deposited in the same apparatus, $BF_3$, $N_2$, He, Ar, and $H_2$ at gas flow rates of 1, 50, 140, 10 and 2 sccm, respectively, were supplied into the chamber from a gas supply unit to secure the operation pressure of $2 \times 10^{-3}$ Torr. Using such conditions and a magnetic field of 875 gauss applied to the central region of the reaction chamber employing an external magnetic coil, the deposition was carried out in an electron cyclotron resonance (ECR) mode. The microwave power was kept at 1400 W. In this particular case, direct current bias of −30 V provided by a dc power supply was applied to the substrate with respect to the grounded chamber. The cBN film was deposited at a substrate temperature of 950° C. for 6 hours in order to obtain a relatively thick continuous film as demonstrated by scanning electron microscopic (SEM) images in FIGS. 5a and 5b. FIGS. 5(a) and 5(b) are SEM plan-view 500 and cross-sectional 502 images of the cBN-diamond composite film deposited by this process, respectively. The top cBN film is about 2.1 µm thick after 6 hours' deposition. The cross-section view shows the cBN film directly deposited on poly-D film, and there is no delamination. A previous investigation showed that there is not any aBN/tBN incubation layer (Zhang et al., Adv. Mater., 16 (2004) 1405, hereby incorporated herein by reference in its entirety). According to FIG. 5(b), the cBND composite layers also show columnar structure elongated across the cBND cross-section from the substrate via diamond—cBN interface to the top of cBN layer.

EXAMPLE 2

Figure 6:
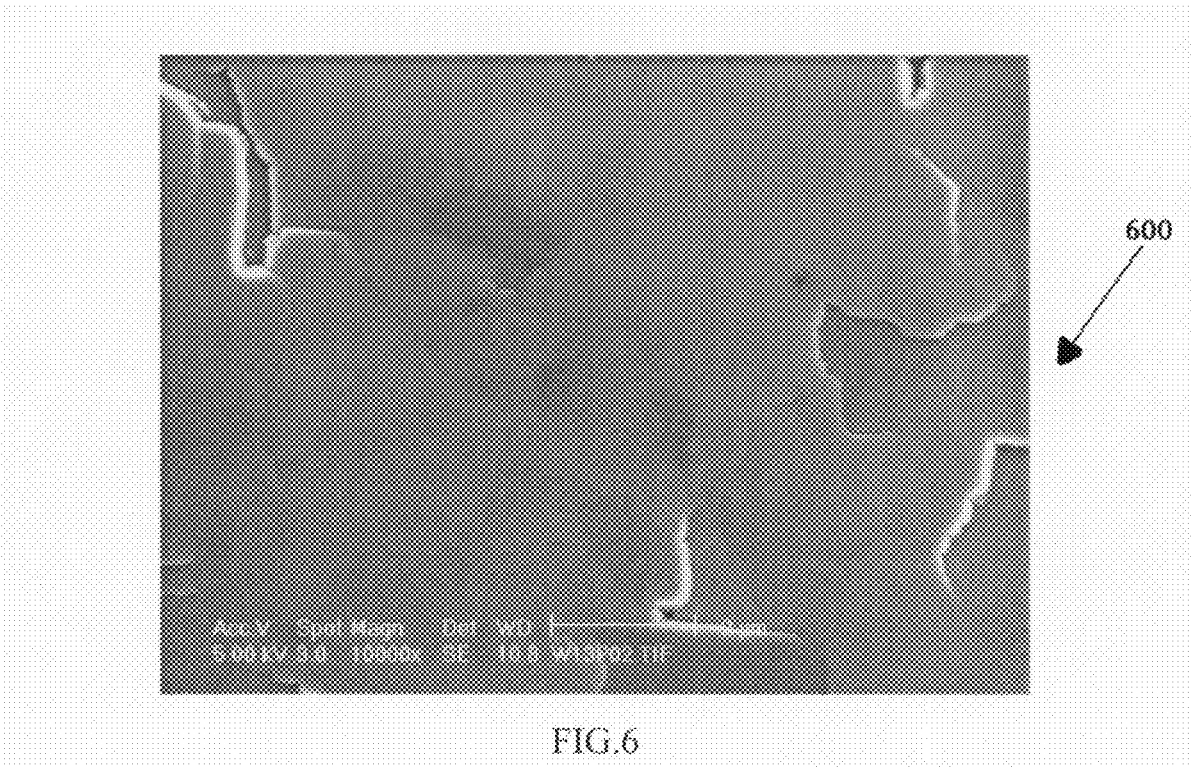
FIG. 6 is a SEM image showing the surface morphology of one example of a (001)-oriented diamond film deposited on Si(001) substrate.

The poly-D intermediate layer in FIG. 5(b) can be replaced by highly-oriented diamond films. FIG. 6 shows an SEM image 600 of the surface morphology of a (001)-oriented diamond film deposited on a Si (001) substrate. In contrast to poly-D film, (001)-oriented diamond film has a smooth surface. The initially small diamond crystallites laterally expanded and coalesced with each other forming large grains with a size of several microns. To achieve oriented diamond films, bias-enhanced nucleation (BEN) was performed in a 5% $CH_4/95\% H_2$ gas mixture at dynamic pressure of 20 Torr provided with a total gas flow rate of 300 sccm. The plasma was induced with a microwave power of 800 W. The substrate temperature was 850° C. and bias was maintained at −150 V.

The BEN took 15 minutes. During the process of diamond growth, the methane concentration was reduced to 0.5% and the total gas flow was kept at 300 sccm, and the total pressure was adjusted to 30 Torr. The substrate maintained 750° C., while the microwave power increased to 1200 W. The cBN deposition was performed in the same deposition system as described above in EXAMPLE 1.

EXAMPLE 3

Figure 7:
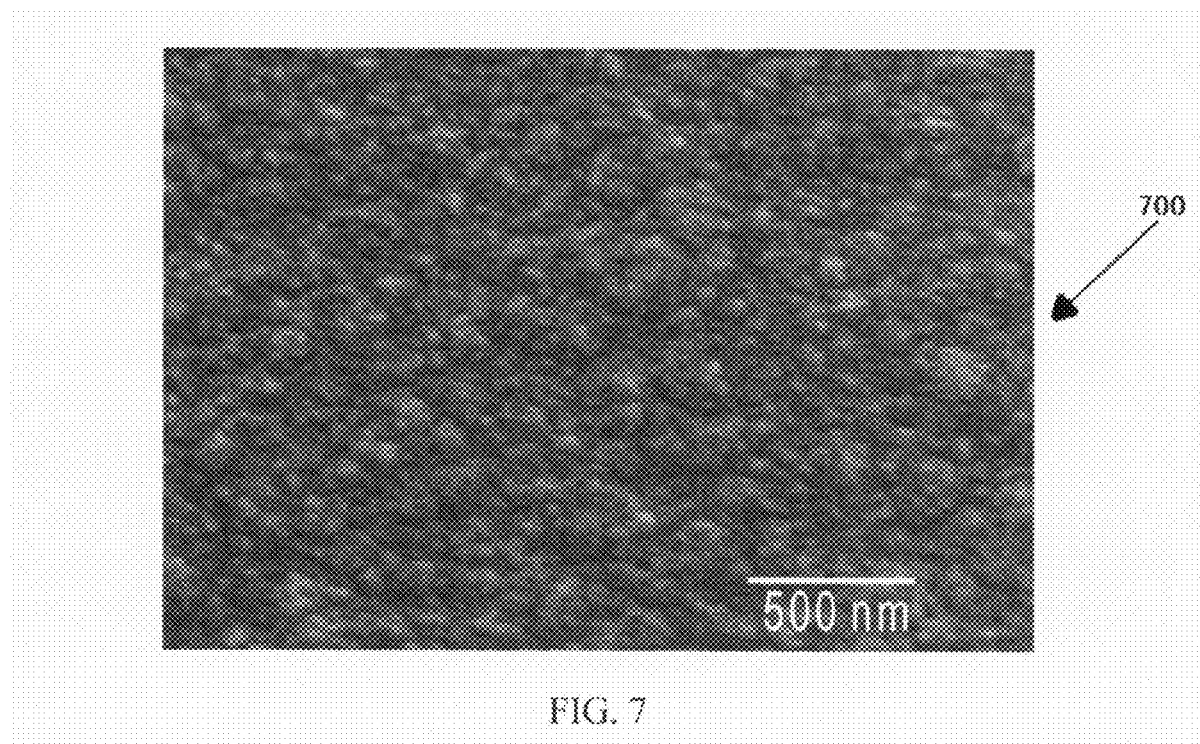
FIG. 7 is a SEM image showing the surface morphology of one example of a nanocrystalline diamond film, FIG. 8($a$) shows a SEM plan-view and FIG. 8($b$) shows a cross-sectional image of one example of a cBN/nano-D composite film with the top cBN layer deposited by ECR-CVD, FIG. 9($a$) shows a SEM plan-view and FIG. 9($b$) shows a cross-sectional image of one example of a cBN/nano-D composite film with the top cBN layer deposited by RF magnetron sputtering.

Nanodiamond films can also be used as the intermediate layer for the SAW devices. The SEM image 700 in FIG. 7 shows the surface morphology of a nanocrystalline diamond film deposited on silicon substrate and shows that the film is composed of nanometer-sized grains. Because the secondary nucleation was predominant during the deposition process, the surface roughness of the nano-D is very low, which is favorable for SAW propagation. According to a previous study (Uemura et al., Jpn. J. Appl. Phys., 41 (2002) 3476, hereby incorporated herein by reference in its entirety), the SAW propagation losses decrease when the diamond grain size diminishes. Therefore, the nanocrystalline diamond with very small grain size is very suitable for use with SAW devices.

The nano-D deposition was performed in the same deposition system as described above in EXAMPLE 1. However, the plasma was induced in a 10% $CH_4/H_2$ mixture at a total pressure of 30 Torr and total gas flow rate of 200 sccm. The microwave power and deposition temperature were maintained at 1200 W and 700° C., respectively. Furthermore, it was found in experiments that the grain size of nanocrystalline diamond could be controlled by deposition conditions, such as temperature, gas pressure and bias voltage.

Figure 8:
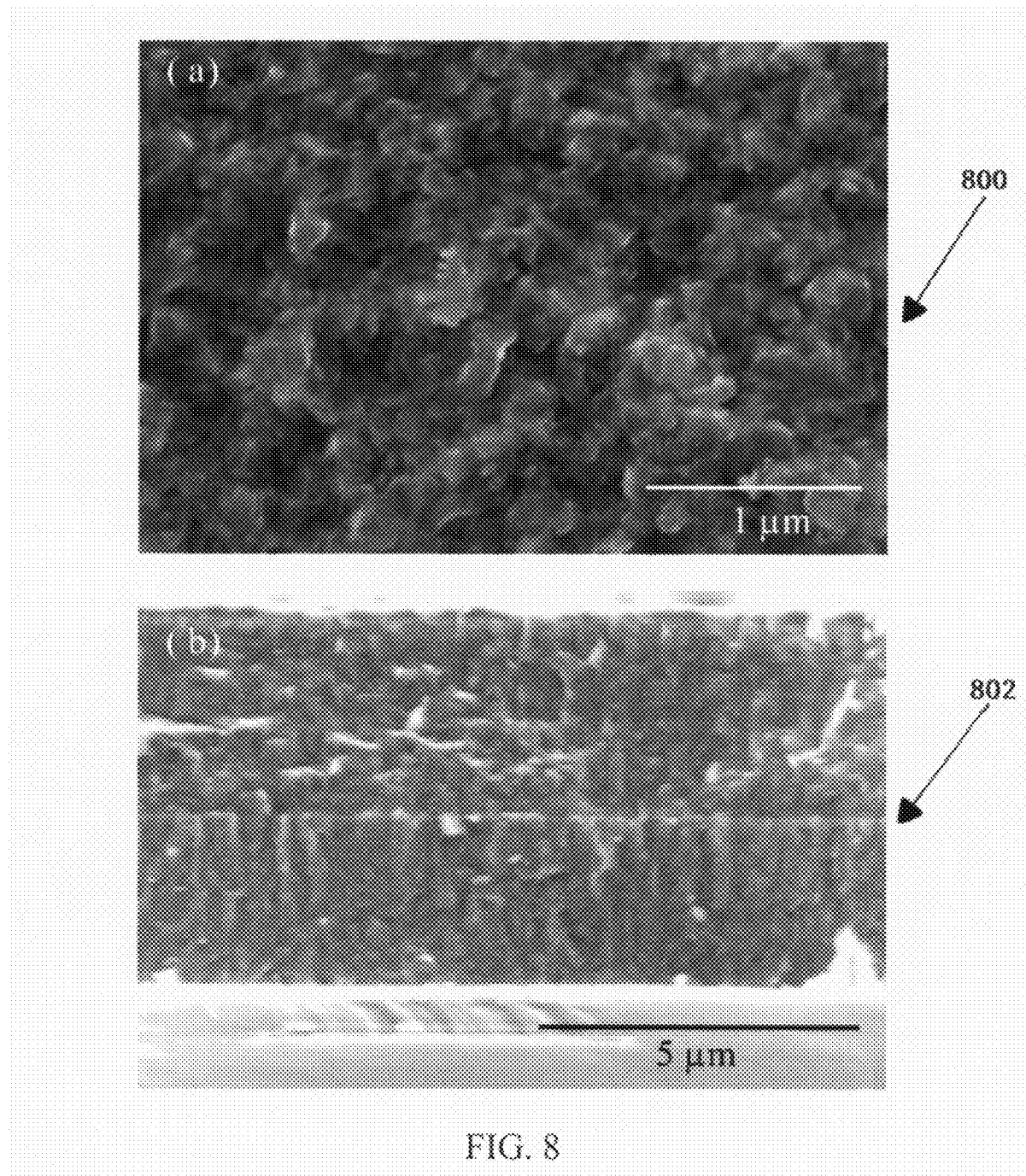

In the cBN-nanodiamond structure, the cBN deposition was also performed in the same deposition system as described above in EXAMPLE 1. FIGS. 8(*a*) and 8(*b*) show the SEM plan-view 800 and cross-sectional 802 images of the cBN-nanodiamond composite film, respectively. It can be seen that the average grain size of the cBN film is about 300 nm. The surface of cBN film can be further smoothed by mechanical polishing with fine diamond powders before the fabrication of IDT. The cross-section view shows that the cBN film was deposited on nanocrystalline diamond adherently.

EXAMPLE 4

Figure 9:
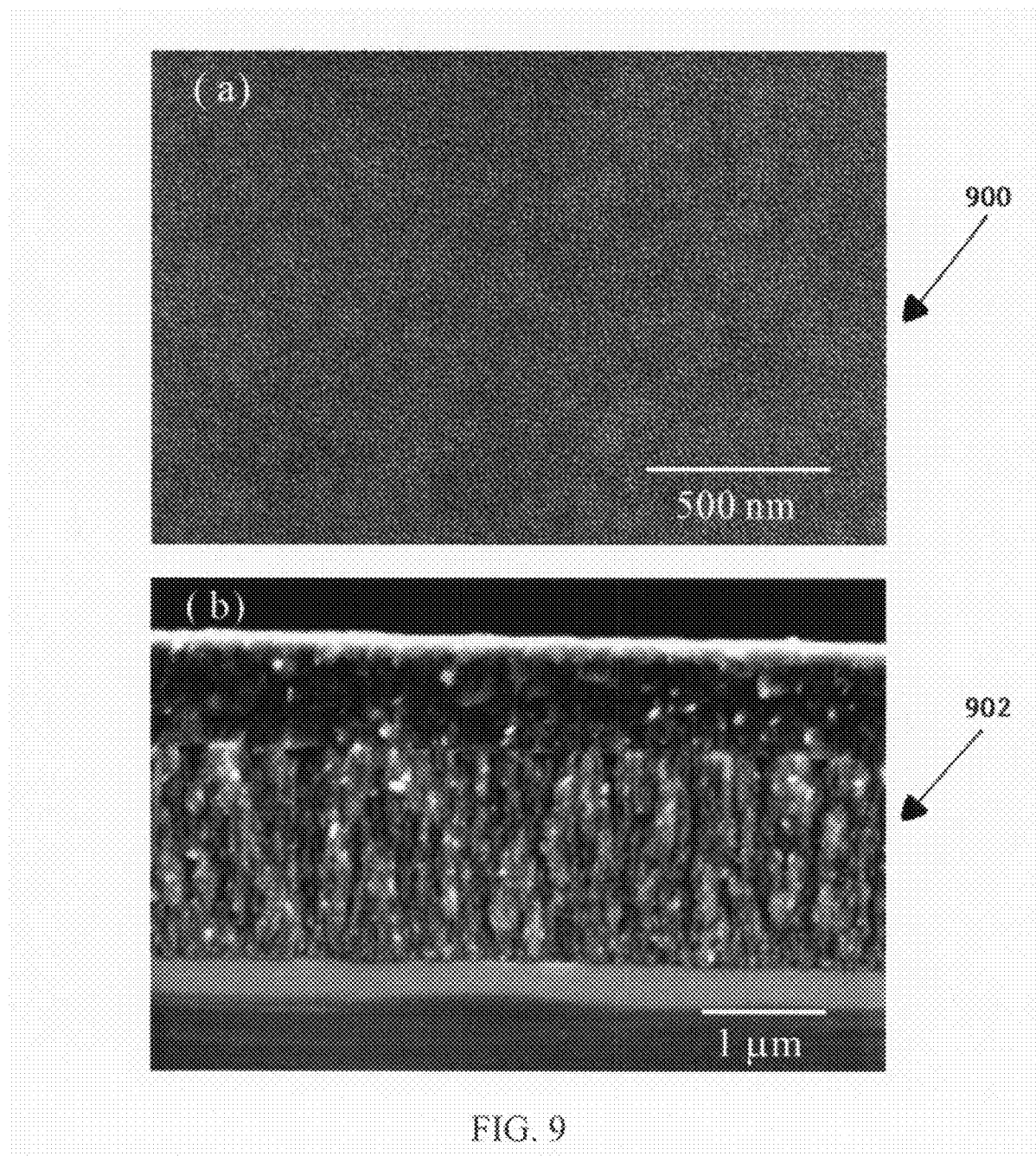

The top cBN film can also be deposited by using a PVD method. FIGS. 9(*a*) and 9(*b*) show the SEM plan-view 900 and cross-sectional 902 images of the cBN/nano-D composite film, respectively, wherein the cBN layer was deposited by radio-frequency magnetron sputtering (RF MS). It is revealed that a cBN film of about 1.1 μm thick was deposited on nano-D film with very smooth surface and interface.

In this case, the nano-D deposition was performed in the same deposition system as described above in EXAMPLE 3. For the deposition of cBN, a high purity (99.99%) hexagonal boron nitride (hBN) target of 3 inch in diameter was used for sputtering. The plasma was induced at 250 W RF (13.56 MHz) power in argon/nitrogen gas mixture at a ratio of 2:1 ($Ar:N_2$) with a total gas flow rate of 30 sccm. The substrate was biased at −60V by a high-frequency (HF) power supply operating at 333 kHz, and was heated up to 870° C. during deposition process.

From FIG. 9(*a*), it can be seen that the top cBN layer is very uniformly, smooth and composed of very small crystallites with an average crystal size of about 10 nm. In contrast to the ECR-MPCVD c-BN films, the surface roughness of the RF MS cBN film is reduced significantly. Thus, the well-defined IDT may be patterned directly on the as-grown surface.

EXAMPLE 5 OF SAW DEVICE BASED ON cBN/DIAMOND COMPOSITE STRUCTURE

The structure of the present SAW device is shown schematically in FIG. 1. In this case, the poly-D deposition on Si (100) was performed in a commercial 1.5 kW ASTeX microwave plasma CVD. The plasma was induced in a 1% $CH_4$/99% $H_2$ mixture at a pressure of 30 Torr and total gas flow rate of 300 sccm. The microwave power and deposition temperature were maintained at 1200 W and 850° C., respectively. The thickness of the poly-D film deposited for 12 h is about 5 μm. Since poly-D does not show a piezoelectric effect it must be combined with a piezoelectric layer for the generation of the SAW. Then the top piezoelectric layer, cBN film was subsequently deposited in the same apparatus in an electron cyclotron resonance (ECR) mode. For the deposition of cBN, $BF_3$, $N_2$, He, Ar, and $H_2$ at gas flow rates of 1, 50, 140, 10 and 1.5 sccm, respectively, were supplied into the chamber to secure the operation pressure of $2 \times 10^{-3}$ Torr. The direct current bias of −30 V was applied to the substrate. The microwave power and deposition temperature were kept at 1400 W and 950° C., respectively. After 4 h deposition, 1.0 μm cBN film was obtained.

Figure 10:
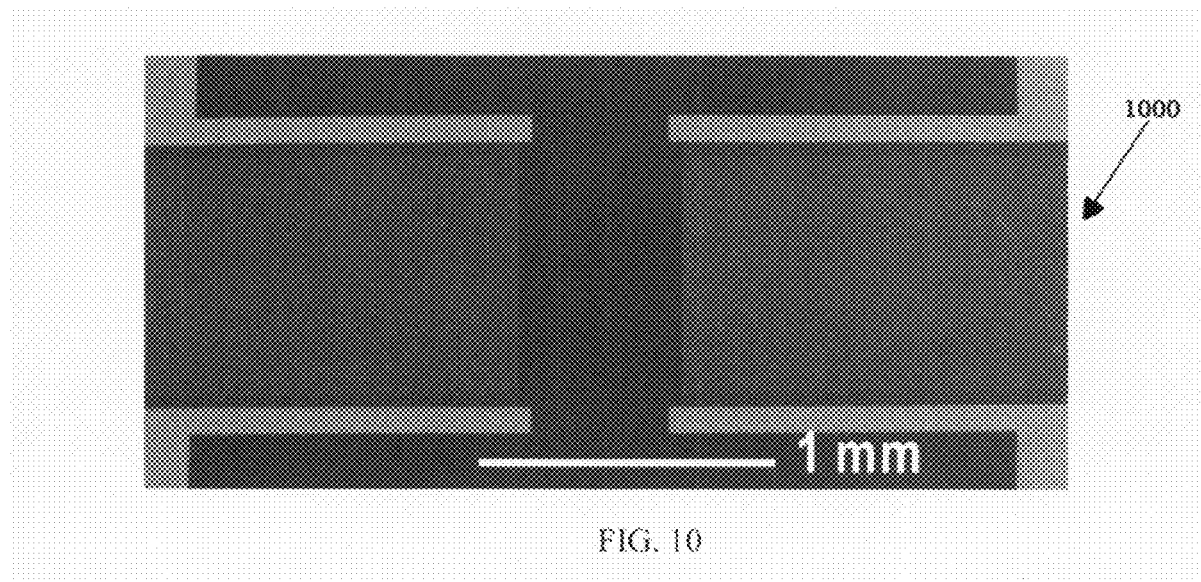
FIG. 10 is a schematic SEM image of one example of the input and output gold inter-digital transducers of a SAW device according to the present invention.
Figure 11:
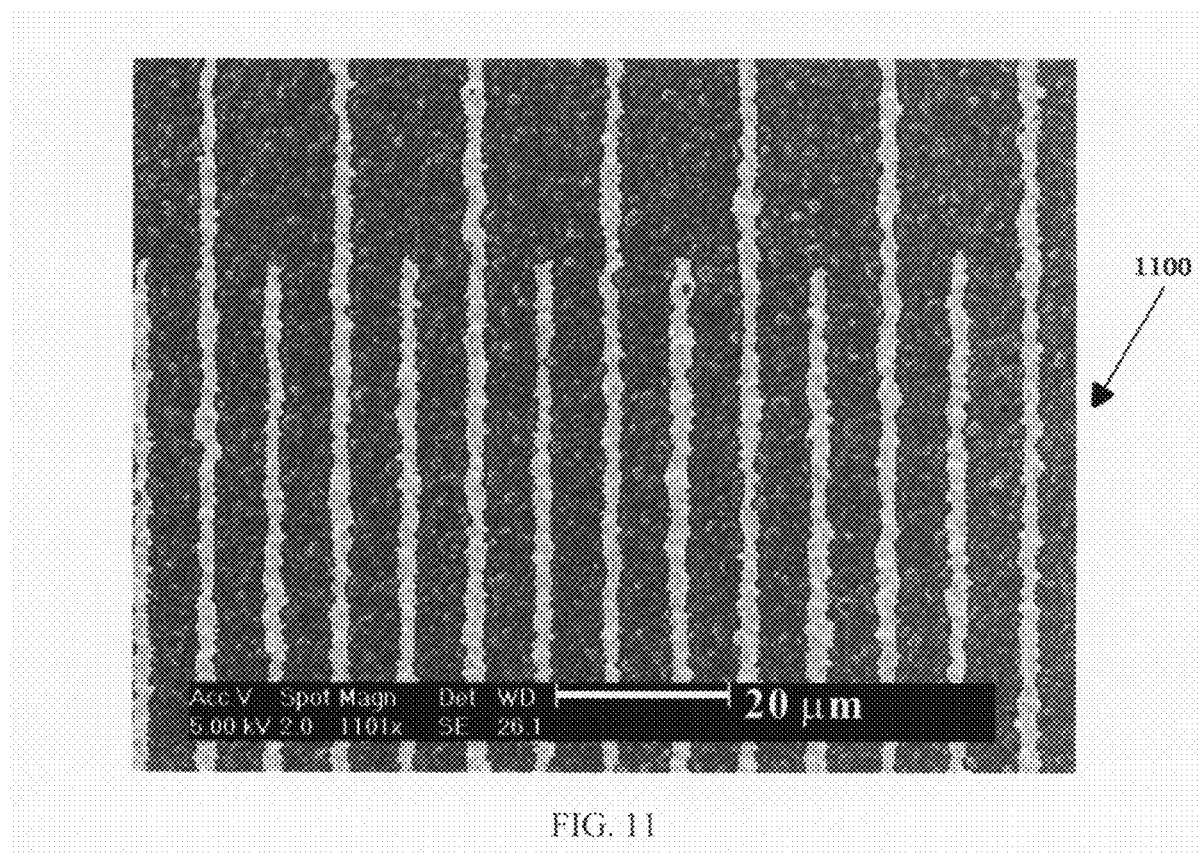
FIG. 11 shows a detailed SEM image of one example of IDTs deposited on the cBN/diamond composite film.

The fabrication of SAW devices was completed by the development of metal or alloy IDTs on the piezoelectric layer by using evaporation or sputtering methods combined with conventional photolithography or electron beam lithography techniques. In order to complete the SAW device fabrication, the 200 nm thick gold IDTs were finally patterned directly on the as-grown cBN/diamond composite film surface without polishing by a magnetron sputtering technique followed by photolithography and wet etching processing. For the deposition of gold IDTs, a high purity gold target of 3 inch in diameter was used for sputtering. The plasma was induced at the 300 W power in argon gas atmosphere with a total pressure of 0.5 Pa. The IDT thickness is very important for the SAW device. When the thickness is smaller than 10 nm the resistivity increases, resulting in an increase in loss. On the other hand, when the thickness of the electrode exceeds 500 nm, the mass addition effect which causes reflection of an SAW due to the thickness and height of the electrode becomes conspicuous, and desired SAW characteristics may be impeded. The present SAW device example comprises input and output gold inter-digital transducers with 100 pairs of fingers for each IDT, as shown in the SEM image 1000 of FIG. 10. In the present example SAW device, the designed IDT line width and space of IDTs were set to 2 μm and 6 μm, respectively so the designed wavelength of the IDTs was set to 16 μm. The IDTs aperture length (W) and inter-IDTs distance (Gap) were set to 880 μm (55λ) and 624 μm (39λ), respectively. FIG. 11 shows the detailed IDTs image 1100 on the cBN/diamond composite film. It can be seen that the rough cBN film surface is harmful to IDTs deposition, which may affect the SAW device performance.

The high frequency characterization of the present SAW devices finally obtained was accomplished by measuring the S parameters using the microwave measurement system including a network analyzer 8720ES (Agilent, USA) connected to a standard probe station Microtech RF-1 (Cascade, USA). The response obtained thus permits the direct determination of the center frequency ($f_0$) and the insertion loss. The acoustic velocity ($v_\phi$) was then deduced from the center frequency by the relation $v_\phi = f_0 \lambda$. According to the measured $S_{11}$ and $S_{21}$ characteristics, the center frequency of the present SAW device based on the cBN/diamond composite structure is 890 MHz, and the insertion loss is 17 dB at a centre frequency of 890 MHz. The thickness of cBN was 1.0 μm and the SAW wavelength was 16 μm. Those conditions correspond to $kh_{Dia}=1.963$ and $kh_{cBN}=0.393$, where $$k = \frac{2\pi}{\lambda}$$

is the wave-vector modulus and h is film thickness. Taking into account the wavelength λ=16 μm fixed by the IDTs periodicity and the center frequency $f_0$=890 MHz, the acoustic phase velocity obtained for the SAW device is $v_\phi$=14240 m/s. The relative low center frequency may be due to the weak thickness (5 μm) of the diamond film as compared with the wave penetration depth which is of the order of λ (16 μm for the present SAW device).

The invention claimed is:

1. A high frequency surface acoustic wave device comprising:
   a) a diamond hard layer;
   b) a cubic boron nitride (cBN) piezoelectric layer formed on said diamond hard layer, wherein said cBN piezoelectric layer is adapted to propagate a surface acoustic wave; and
   c) a pair of interdigital transducer electrodes (IDT) formed on said cBN piezoelectric layer which are adapted to perform conversion between an electrical signal and a surface acoustic wave.

2. A device according to claim 1 wherein the diamond layer comprises a supporting layer.

3. A device according to claim 2 wherein the supporting layer comprises a semiconductor material, an insulating material, or a metal.

4. A device according to claim 2 wherein the supporting layer has been pretreated to enhance diamond formation.

5. A device according to claim 4 wherein said supporting layer is subject to enhanced seeding in hard powder suspension, pre-scratching or bias enhanced nucleation before deposition of the diamond hard layer.

6. A device according to claim 1 wherein the diamond hard layer comprises one of single-crystal diamond wafers, oriented (heteroepitaxial) diamond, randomly-oriented polycrystalline diamond (poly-D), and nanocrystalline diamond (nano-D) films.

7. A device according to claim 6 wherein the oriented (heteroepitaxial) diamond, randomly-oriented polycrystalline diamond (poly-D), or nanocrystalline diamond (nano-D) films are deposited by cold or thermal plasma CVD processes.

8. The device according to claim 6 wherein the single crystal diamond is synthesized by high temperature and high pressure.

9. A device according to claim 1 wherein the cBN piezoelectric layer has a sound velocity close to that of diamond.

10. A device according to claim 1 wherein the cBN piezoelectric layer is deposited by ion assisted physical vapor deposition (PVD) or plasma-enhanced (or ion assisted) chemical vapor deposition (PECVD).

11. The device according to claim 1 wherein a cBN piezoelectric layer without a soft $sp^2$-BN incubation layer for cBN nucleation is directly deposited on the diamond hard layer.

12. The device according to claim 1 wherein the interdigital electrodes (IDT) comprise metal or alloy.

13. The device according to claim 1 wherein the interdigital electrodes formed on cBN piezoelectric layer are fabricated using evaporation or sputtering methods combined with conventional photolithography or electron beam lithography techniques.

14. The device according to claim 1 wherein the cBN/diamond composite structure has a very small velocity dispersion on the interface.

* * * * *

UNITED STATES PATENT AND TRADEMARK OFFICE
CERTIFICATE OF CORRECTION

PATENT NO. : 7,579,759 B2
APPLICATION NO. : 11/760996
DATED : August 25, 2009
INVENTOR(S) : Lee et al.

It is certified that error appears in the above-identified patent and that said Letters Patent is hereby corrected as shown below:

On the Title Page:

Item (75) Inventors:

Delete:

"Shuit-Tong Lee, Hong Kong (HK);
Wen-Jun Zhang, Hong Kong (HK);
You-Sheng Zou, Hong Kong (CN); Igor Bello, Hong Kong (HK); Kwok Leung Ma, Hong Kong (HK); Kar Man Leung, Hong Kong (HK);
Yat Ming Chong, Hong Kong (HK)"

Insert:

--Shuit-Tong Lee, N.T. (HK);
Wen-Jun Zhang, N.T. (HK);
You-Sheng Zou, Jiangxi Province (CN); Igor Bello, Kowloon (HK); Kwok Leung Ma, Ap Lei Chau (HK); Kar Man Leung, N.T. (HK);
Yat Ming Chong, N.T. (HK)--

Signed and Sealed this

Thirteenth Day of April, 2010

David J. Kappos
*Director of the United States Patent and Trademark Office*